United States Patent
Wang

(10) Patent No.: US 6,188,101 B1
(45) Date of Patent: *Feb. 13, 2001

(54) FLASH EPROM CELL WITH REDUCED SHORT CHANNEL EFFECT AND METHOD FOR PROVIDING SAME

(75) Inventor: Janet Wang, San Francisco, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/006,757

(22) Filed: Jan. 14, 1998

(51) Int. Cl.$^7$ ...................................... H01L 29/76
(52) U.S. Cl. .................... 257/314; 257/315; 257/404; 257/640; 257/914
(58) Field of Search ..................... 438/600, 276, 438/264, 513, 525, 520, 407, 528; 257/309, 315, 314, 322, 404, 327, 640, 649, 914

(56) References Cited

U.S. PATENT DOCUMENTS

| | | | | |
|---|---|---|---|---|
| 5,446,298 | * | 8/1995 | Kojima ................................ | 257/314 |
| 5,500,816 | * | 3/1996 | Kobayashi ........................... | 365/185 |
| 5,504,358 | * | 4/1996 | Hong .................................... | 257/315 |
| 5,514,902 | * | 5/1996 | Kawasaki et al. ................... | 257/607 |
| 5,516,707 | * | 5/1996 | Loh et al. ............................ | 438/513 |
| 5,557,122 | * | 9/1996 | Shrivastava et al. ................ | 257/309 |
| 5,610,084 | * | 3/1997 | Solo de Zaldivar ................. | 438/600 |
| 5,672,521 | * | 9/1997 | Barsan et al. ........................ | 438/276 |
| 5,689,459 | * | 11/1997 | Chang et al. ........................ | 257/309 |
| 5,750,435 | * | 5/1998 | Pan ....................................... | 438/525 |
| 5,834,351 | * | 11/1998 | Chang et al. ........................ | 438/266 |
| 5,837,585 | * | 11/1998 | Wu et al. ............................. | 438/264 |
| 5,888,870 | * | 3/1999 | Gardner et al. ..................... | 438/261 |
| 5,940,325 | * | 8/1999 | Chang et al. .................... | 365/185.28 |
| 5,972,783 | * | 10/1999 | Arai et al. ............................ | 438/513 |
| 5,998,828 | * | 12/1999 | Ueno et al. .......................... | 257/315 |

OTHER PUBLICATIONS

Novel NICE (Nitrogen Implantation inot CMOS Gate Electrode and Source–Drain) Structure for High Reliability and High Performance 0.26 um Dual Gate CMOS, T. Kuroi et al., IDEM Dec. 1993 pp. 325–328.*

* cited by examiner

*Primary Examiner*—Olik Chaudhuri
*Assistant Examiner*—William David Coleman
(74) *Attorney, Agent, or Firm*—Sawyer Lawyer Group LLP

(57) ABSTRACT

Reduction in the short channel effect of a Flash EPROM cell is described. A method includes forming a gate structure on a substrate structure, and performing a nitrogen implant. Further included is performing device doping, wherein the nitrogen implant inhibits diffusion of dopant material into a channel of the cell. A Flash EPROM cell with reduced short channel effect includes a gate region, a drain region, and a source region, the source region and drain region defining a channel region therebetween beneath the gate region. The source region and drain region further have nitrogen implanted therein to reduce lateral diffusion of dopant material into the channel region.

6 Claims, 2 Drawing Sheets

US 6,188,101 B1

FLASH EPROM CELL WITH REDUCED SHORT CHANNEL EFFECT AND METHOD FOR PROVIDING SAME

FIELD OF THE INVENTION

The present invention relates to Flash EPROMs, and more particularly to Flash EPROMs with reduced short channel effect.

BACKGROUND OF THE INVENTION

Nonvolatile programmable memories operate similar to read only memories with the attribute of being programmable at least once. Included in nonvolatile memory types are Flash EPROMs (ultraviolet erasable programmable read only memories). Typical Flash EPROM cell structures are either charged or discharged in order to program or erase the cells and store information. In general terms, charging refers to the activity of putting electrons onto a floating gate of the cell, while discharging refers to the activity of taking electrons off of the floating gate of the cell. When charged, the cell has a low current and a high threshold voltage, $V_t$. Conversely, when discharged, the cell has a high current and a low $V_t$.

Presently, scaling down of Flash EPROM cells has been considered critical in continuing the trend toward higher device density. Typically, however, the scaling of cell size has not been accompanied by a scaling in the internal operation voltage requirement for the cell. As the size of the cells shrink, short channel effect becomes problematic. Short channel effect generally refers to the problem associated with drain induced barrier lowering (DIBL) and threshold voltage roll-off with channel length. With larger cell sizes, the channel between the source and drain is long and the transient electrical field generated is very small during the charging period, i.e., during the period when the voltage is applied to the source. However, as the channel becomes shorter due to cell size shrinkage, short channel effect becomes more problematic.

Attempts to combat the problem of short channel effect include the reduction of doping in a source side implant. The reduction in doping usually leads to less diffusion of the source dopant in the channel. However, an inherent limit to the doping reduction exists, since a certain level of doping is required to maintain proper cell erase functionality.

Accordingly, a need exists for a manner of reducing short channel effect in a Flash EPROM cell, while maintaining reliable cell operation through preferred doping levels.

SUMMARY OF THE INVENTION

The present invention provides reduction in the short channel effect of a Flash EPROM cell. The method includes forming a gate structure on the substrate structure, and performing a nitrogen implant. Further included is performing device doping, wherein the nitrogen implant inhibits diffusion of dopant material into a channel of the cell. A Flash EPROM cell with reduced short channel effect includes a gate region, a drain region, and a source region, the source region and drain region defining a channel region therebetween beneath the gate region. The source region and drain region further have nitrogen implanted therein to reduce lateral diffusion of dopant material into the channel region.

With the present invention, a straightforward addition of implanting nitrogen into a Flash EPROM cell effectively achieves a reduction in short channel effect, while allowing maintenance of desired dopant levels in the source region for chosen cell erase operation. These and other advantages of the aspects of the present invention will be more fully understood in conjunction with the following detailed description and accompanying drawings.

DETAILED DESCRIPTION

The present invention relates to nitrogen implantations of a Flash EPROM cell to reduce short channel effect. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
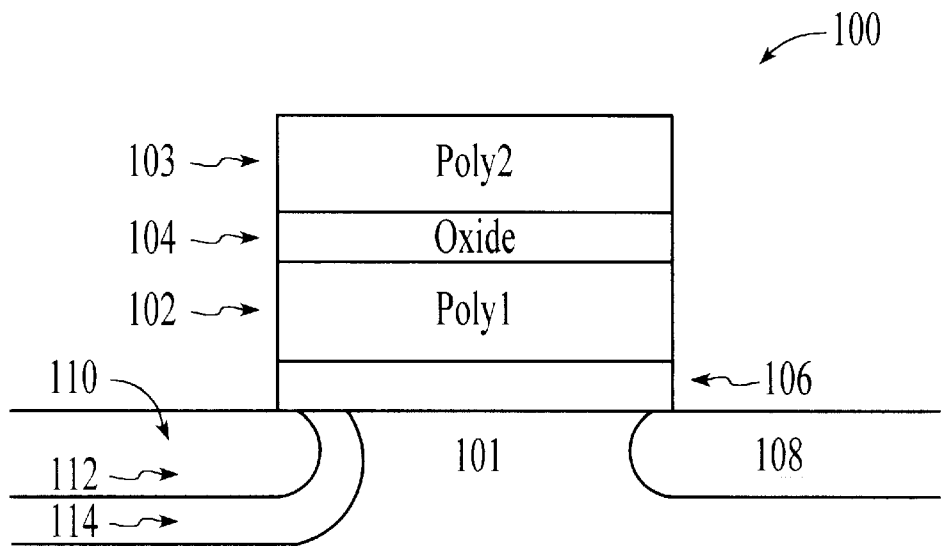
FIG. 1 illustrates a partial cross-sectional view of a conventional Flash EPROM cell.

FIG. 1 illustrates a partial cross-sectional view of a Flash EPROM cell 100 that has been processed in accordance with the prior art through subsequent source and drain implant stages. The cell 100 includes first and second polysilicon (poly-Si) layers 102 and 103, i.e., floating gate and control gate, respectively, and an oxide region 104 therebetween, e.g., an oxide-nitride-oxide (ONO) region. A tunnel oxide region 106 is further included with a thickness of between about 80–100 angstroms, for example, between the first poly-Si layer 102 and the substrate 101, e.g., silicon area. A first implant 114 is optional, but typically is provided in source region 110 to reduce unwanted band-to-band tunneling current. As is shown, the implant could be brought to a position well inside the gate area/region of the device.

A second implant 112 is performed to provide source/drain regions 112/108. The second implant with its high surface concentration under the source overlap region suitably facilitates the proper erasure of the Flash code, as is well understood by those skilled in the art. Typically, the substrate 101 is doped with a p-type dopant, such as boron, while the source and drain regions are doped with an n-type dopant, such as phosphorous or arsenic, as is well known to those skilled in the art. As is further well understood, a core implant of boron of approximately $10^{17}$ atoms/cm$^3$ is usually done at the surface of the substrate 10. This surface doping typically creates an ultraviolet threshold voltage, Uvvt, approximately equal to the discharge threshold voltage, $V_t$, for example 2 V.

Figure 2:
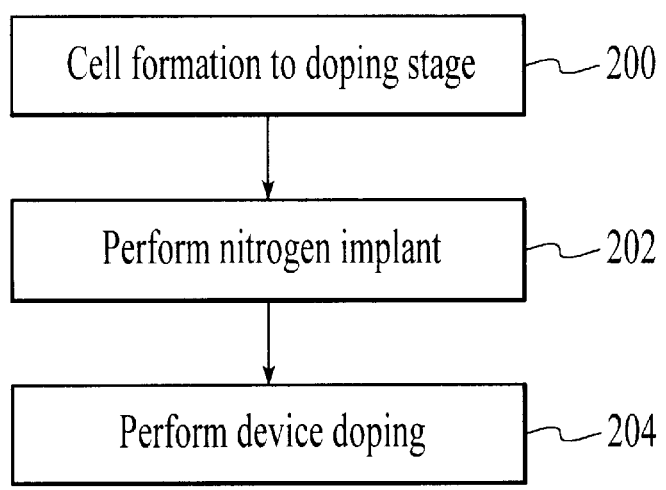
FIG. 2 illustrates a block flow diagram of a process for reducing short channel effect in a Flash EPROM cell in accordance with a preferred embodiment of the present invention.
Figure 3A:
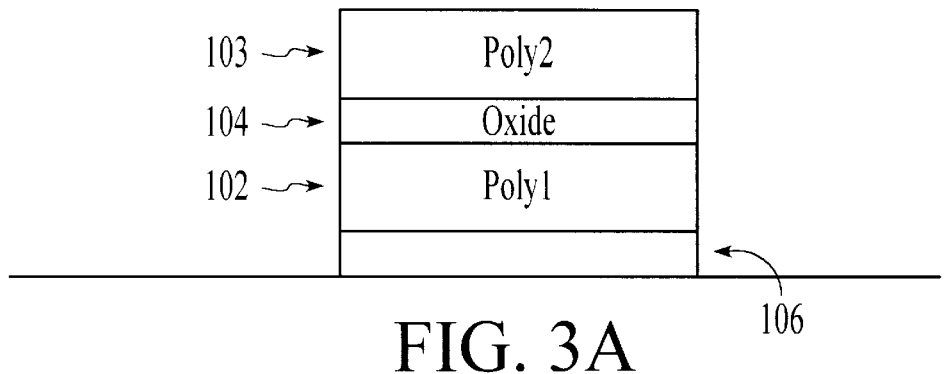
FIGS. 3a–3c illustrate a partial cross-sectional view of a Flash EPROM cell during the processing described with reference to FIG. 2 in accordance with a preferred embodiment of the present invention.
Figure 3B:
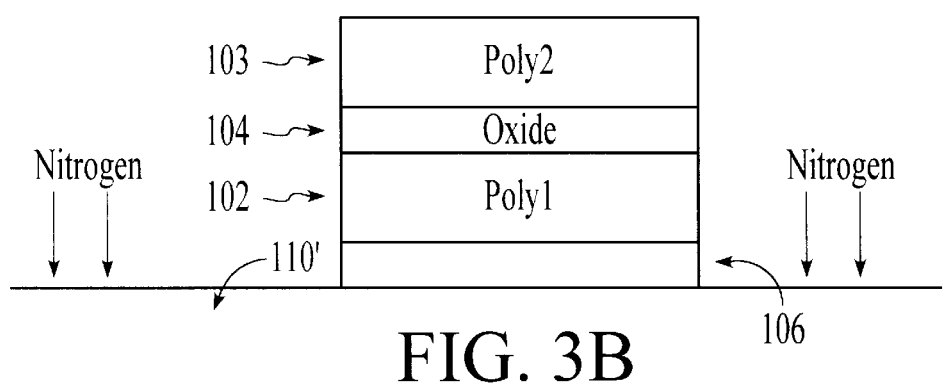
Figure 3C:
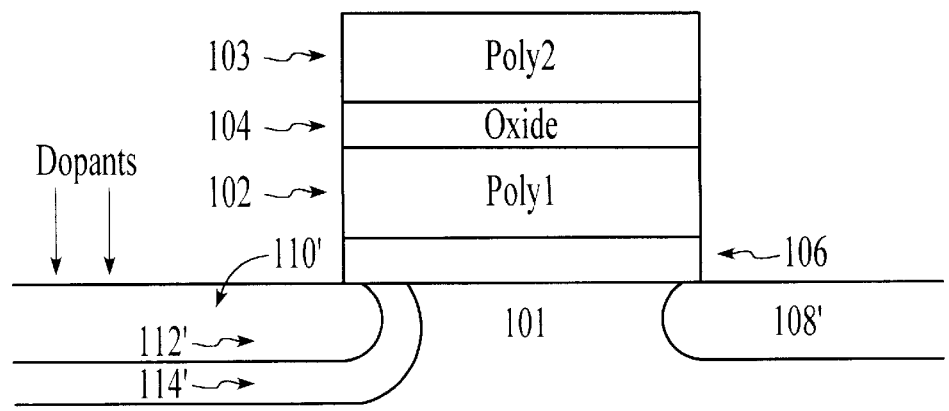

As discussed above, short channel effect problems arise as the size of the cell 100 is reduced. Through the aspects of the present invention, a straightforward modification to conventional cell formation provides reduction in these problems without denigrating cell functionality. FIG. 2 presents a block flow diagram of a preferred embodiment of the present invention, while FIGS. 3a, 3b, and 3c illustrate partial cross-sectional views of a Flash EPROM cell, as formed during the processing represented in the flow diagram of FIG. 2.

Referring to FIG. 2, the process initiates with the formation of a Flash EPROM cell up to a stage of device doping in accordance with conventional techniques (step 200). Thus, regions 102, 103, 104, and 106, i.e., a gate structure, as described with reference to FIG. 1, are formed. The process then proceeds with a nitrogen implantation into a source region 110' (step 202), as shown in FIG. 3b. Suitably, nitrogen is implanted at a dose sufficient for reducing the short channel effect for a given cell, such as at a dose of about 4 $e^{15}/cm^2$. This nitrogen implantation may also be done on the drain side, as shown, in order to help reduce drain dopant diffusion and for ease of processing, e.g., by not requiring an additional mask to avoid implanting the nitrogen in the drain side. Once the nitrogen is implanted, device doping is suitably performed (step 204). By way of example, a phosphorous (Ph) dopant is provided and followed by provision of an arsenic (As) dopant to form source regions 114' and 112', respectively, as represented in FIG. 3c. Of course, the arsenic doping suitably results in doping of the drain 108', as described with reference to FIG. 1.

With the addition of implanting of nitrogen at a source of a Flash EPROM cell, less diffusion of the source dopants into the channel effectively results. Of course, when also implanted in the drain, less diffusion of drain dopants occurs. The emphasis on the use of nitrogen in the source side herein reflects the benefit of reduced phosphorous diffusion, the phosphorous diffusion being greater than presently desired. Through the reduction of lateral diffusion into the channel, smaller cell structures may be formed that still maintain cell erasure functionality. Further, while adding to the processing steps of conventional cell formation, the nitrogen implantation conveniently occurs just prior to the doping. Thus, preservation of desired cell operation for a chosen level of doping is readily accommodated as cell sizes are reduced.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A Flash EPROM cell with reduced short channel effect, the Flash EPROM cell comprising:

a gate region, the gate region including a floating gate and a control gate;

a drain region; and a source region, the source region and drain region defining a channel region therebetween beneath the gate region, the source region having nitrogen implanted soley therein prior to dopant material to reduce lateral diffusion of the dopant material into the channel region.

2. The cell of claim 1 wherein the dopant material comprises arsenic.

3. The cell of claim 2 wherein the dopant material in the source region further comprises phosphorous.

4. The cell of claim 1 wherein the gate region further comprises a floating gate and a control gate with an oxide layer therebetween.

5. The cell of claim 4 wherein the gate region further comprises a tunnel oxide region between the floating gate and a silicon substrate.

6. The cell of claim 4 wherein the floating gate and control gate further comprise first and second polysilicon layers and the oxide layer further comprises an oxide-nitride-oxide layer.

* * * * *